US005535227A

United States Patent [19]
Silvano

[11] Patent Number: 5,535,227
[45] Date of Patent: Jul. 9, 1996

[54] DIGITAL INFORMATION ERROR CORRECTING APPARATUS FOR SINGLE ERROR CORRECTING (SEC), DOUBLE ERROR DETECTING (DED), SINGLE BYTE ERROR DETECTING (SBED), AND ODD NUMBERED SINGLE BYTE ERROR CORRECTING (OSBEC)

[75] Inventor: Cristina Silvano, Milan, Italy

[73] Assignee: Bull HN Information Systems Italia S.p.A., Turin, Italy

[21] Appl. No.: 248,140

[22] Filed: May 23, 1994

[30] Foreign Application Priority Data

Jun. 10, 1993 [EP] European Pat. Off. .............. 93830254

[51] Int. Cl.$^6$ ........................................... G06F 11/10
[52] U.S. Cl. ........................................ 371/40.4; 371/37.6
[58] Field of Search ............................ 371/40.1, 40.4, 371/39.1, 37.6, 37.1

[56] References Cited

FOREIGN PATENT DOCUMENTS

| | | |
|---|---|---|
| 0114938 | 8/1984 | European Pat. Off. . |
| 0147336 | 7/1985 | European Pat. Off. . |
| 0300139 | 1/1989 | European Pat. Off. . |
| 2164179 | 3/1986 | United Kingdom . |

OTHER PUBLICATIONS

Fujiwara, E., et al, "Rotational Byte Error Detecting Codes for Memory Systems", *Trans. IECE of Japan*, vol. E64, No. 5, May 1981, pp. 342–349.
European Search Report.

*Primary Examiner*—Stephen M. Baker
*Attorney, Agent, or Firm*—Rosen, Dainow & Jacobs

[57] ABSTRACT

Digital information error correcting apparatus for the correction of single errors (SEC), the detection of double errors (DED) and multiple single byte errors (SBD) and the correction of an odd number of single byte errors (ODD-SBC) comprising a syndrome generator with generation matrices constituted by the juxtaposition of a plurality of non-zero and distinct submatrices having b rows and r columns where b is the number of bits per byte and r ($r \geq b+2$) is the number of syndrome and error check bits, each constituted by an identity submatrix Ib having b rows and columns, vertically aligned over a matrix H having r–b rows and b columns formed by an even number $\geq 2$ of rows of all 1 elements and the remaining rows being all 0 elements.

7 Claims, 4 Drawing Sheets

FIG. 1
PRIOR ART

DIGITAL INFORMATION ERROR CORRECTING APPARATUS FOR SINGLE ERROR CORRECTING (SEC), DOUBLE ERROR DETECTING (DED), SINGLE BYTE ERROR DETECTING (SBED), AND ODD NUMBERED SINGLE BYTE ERROR CORRECTING (OSBEC)

BACKGROUND OF THE INVENTION

The present invention relates to a digital information error checking and correcting apparatus for performing single error correcting (SEC), double error detecting (DED), single byte error detecting (SBED), and odd numbered single byte error correcting (OSBEC).

To improve the reliability of computer memory systems, error-correcting codes (ECC) have been widely used to ensure protection against intermittent, permanent and transitory failures.

SEC-DED codes have been proposed for use in memory systems organized on the basis on one bit per chip.

In this way any failure in a single memory component can influence at most only a single bit of the digital information, hereinafter defined as a codeword.

Standard memory device technology is moving towards ever higher levels of integration and multiple-bit-per-chip memory organizations are becoming common.

In this case a failure in a memory component or chip can generate different types of error:

a failure of a single cell can generate a single error, but an overall chip failure can simultaneously generate an error of several bits, up to a maximum of b, where b is the number of bits simultaneously extracted from the individual memory component.

Therefore, in a memory organization of b bits per chip, a chip failure can generate a "byte error" that is an error configuration consisting of from one up to b error bits, in dependence on the type of failure: cell failure, word line failure, bit line failure, or partial or total chip failure.

The SEC-DED codes are not suitable for memories having b bits per chip since multiple errors are not correctable and the uncorrectable error (UE) rate can become high in the case of chip failure resulting in a high number of multiple byte errors.

Another serious problem is constituted by the loss of data integrity due to the fact that a multiple error could be wrongly corrected by a SEC-DED code.

DESCRIPTION OF THE PRIOR ART

To reduce the uncorrectable error rate and increase the data integrity there have been proposed different codes with the ability to detect multiple byte errors (or even correction of multiple byte errors).

In this connection the following publications can be cited:

Document 1:—C. L Chen. My Hsiao: Error Correcting Codes for Semiconductor Memory Application: A state of the Art Review. IBM Journal Of Research & Development, Vol. 28, N. 2, March 1984

Document 2:—C. L Chen. "Symbol Error-Correcting Codes for Computer Memory Systems" IEEE Transactions on Computers, Vol. 41, pp 252–256. February 1992.

Document 3:—S. Kaneda and E Fujiwara: "Single Byte Error Correcting—Double Byte Error Detecting Codes for Memory Systems" IEEE Transactions on Computers, Vol. C-31 pp 596–602, July 1982.

To obtain the ability to detect multiple byte errors, it is not necessary to significantly increase the number of bits in the error code associated with the SEC-DED function, and it is possible to construct systematic codes; however, the codes proposed for the correction of multiple byte errors, e.g., multiple errors in a single byte, require a significant number of additional bits and do not have a systematic structure.

Moreover, the solutions proposed are not generalized but are limited to specific cases.

The following table presents an indication of the number of check bits needed as a function of the number of bits b per byte and the number of data bits which, together with the check code, form the code word.

Column A relates to SEC-DED-SBED codes.

Column C relates to SEC-DED-OSBEC codes.

Column B relates to SEC-DED-SBED-OSBEC codes developed and used in accordance with the present invention.

| DATA BITS | 16 | | | 32 | | | 64 | | | 128 | | |
|---|---|---|---|---|---|---|---|---|---|---|---|---|
| b | A | B | C | A | B | C | A | B | C | A | B | C |
| 3 | 6 | 6 | 9 | 7 | 8 | 12 | 8 | 8 | 12 | 9 | 9 | 12 |
| 4 | 6 | 8 | 12 | 7 | 8 | 12 | 8 | 9 | 14 | 9 | 10 | 16 |
| 5 | 7 | 9 | 15 | 8 | 9 | 15 | 9 | 10 | 15 | 9 | 10 | 15 |
| 6 | 8 | 9 | 18 | 8 | 10 | 18 | 9 | 11 | 18 | 10 | 12 | 18 |
| 7 | 9 | 10 | 21 | 9 | 11 | 21 | 10 | 12 | 21 | 11 | 13 | 21 |
| 8 | 10 | 11 | 24 | 10 | 12 | 24 | 10 | 13 | 24 | 11 | 14 | 24 |
| 16 | 18 | 18 | 48 | 18 | 19 | 48 | 18 | 20 | 48 | 18 | 21 | 48 |

As can be seen from the table, to obtain the SEC-DED-OSB function (Column C) a check code with a considerable number of bits is necessary, in practice about twice that required for the SEC-DED-SBED codes.

The code structure is moreover not systematic and makes the operation of decoding, error detection and error correction rather complex.

Greater complexity is inevitably associated with a longer execution time for such operations, with degradation of the memory performance.

SUMMARY OF THE INVENTION

This disadvantage is avoided by the error correction apparatus of the present invention which allows correction of multiple byte errors to be achieved if these are of odd number.

In this way it is ensured that at least 50% of possible byte errors are covered.

The level of reliability of computer memory systems is thus improved without substantially increasing the constructional complexity and cost.

Moreover, the codes used are systematic and it is important to underline that this type of code has the significant advantage, over non-systematic codes, of keeping the data bits distinct from the code bits.

In high performance systems, systematic codes make the flow of data between processors and memory faster because they avoid having to encode the data to write to memory and having to decode and then separate the data from the code words read from the memory.

According to a further aspect of the present invention, the syndrome generation matrix is "extended" with the addition of submatrices to allow the generation of error codes and syndromes with a smaller number of bits without substantially limiting the real time odd-multiple-byte error correction capacity. For that limited number of bytes which is not directly correctable, the correction of odd numbers of multiple errors is however made possible by the apparatus of the invention by calling up appropriate procedures.

BRIEF DESCRIPTION OF THE DRAWINGS

The characteristics and advantages of the present invention will become more clearly apparent from the following description of a preferred embodiment of the invention and from the attached drawings in which:

FIG. 1 shows a parity check matrix, known in the art, with which is identified an odd multiple of bytes error correcting property, generalizable to several classes of matrices and conveniently employed for this purpose in the apparatus forming the subject of the present invention;

DESCRIPTION OF THE PREFERRED EMBODIMENT

Figure 1:
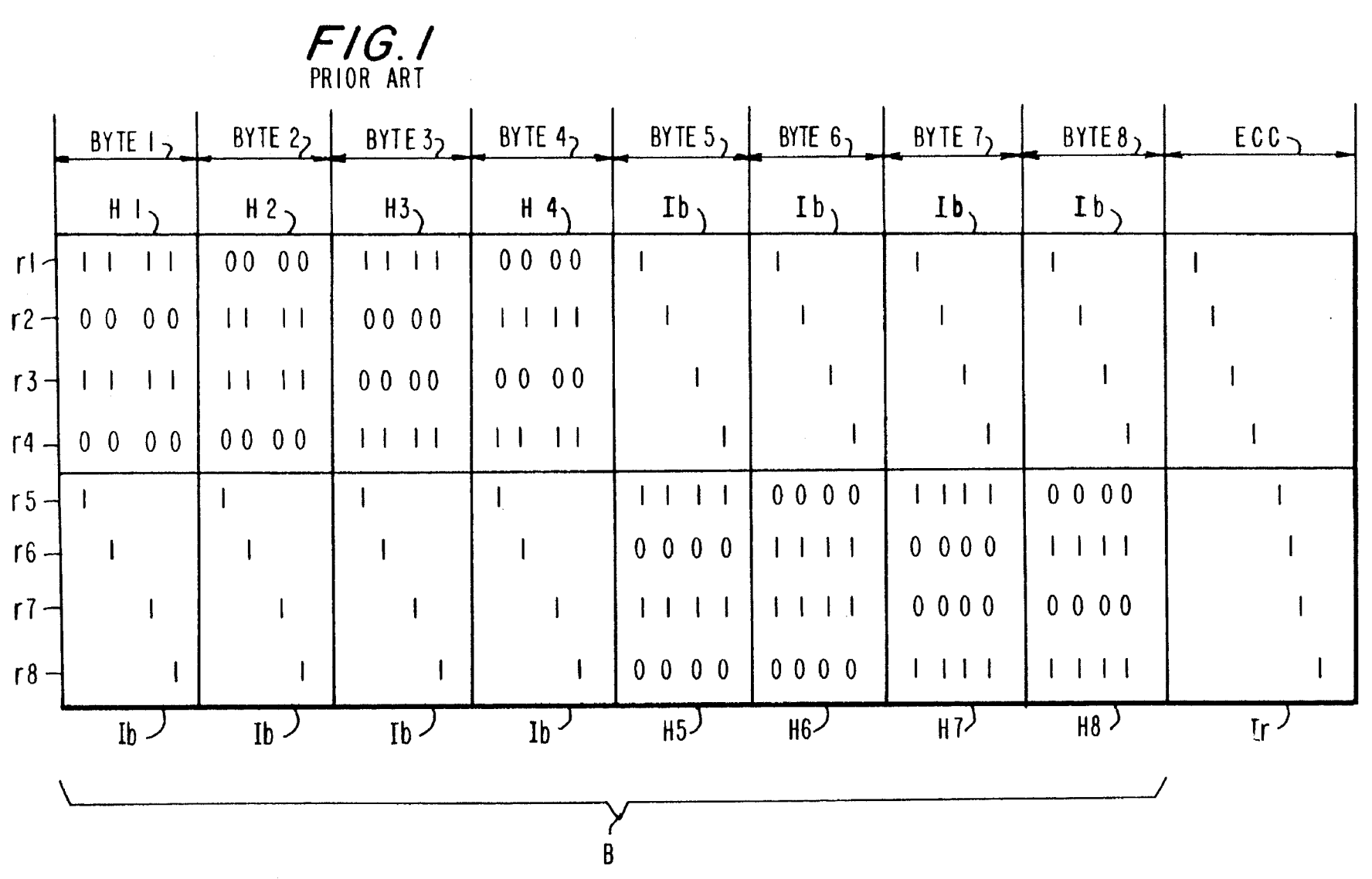
Figure 2:
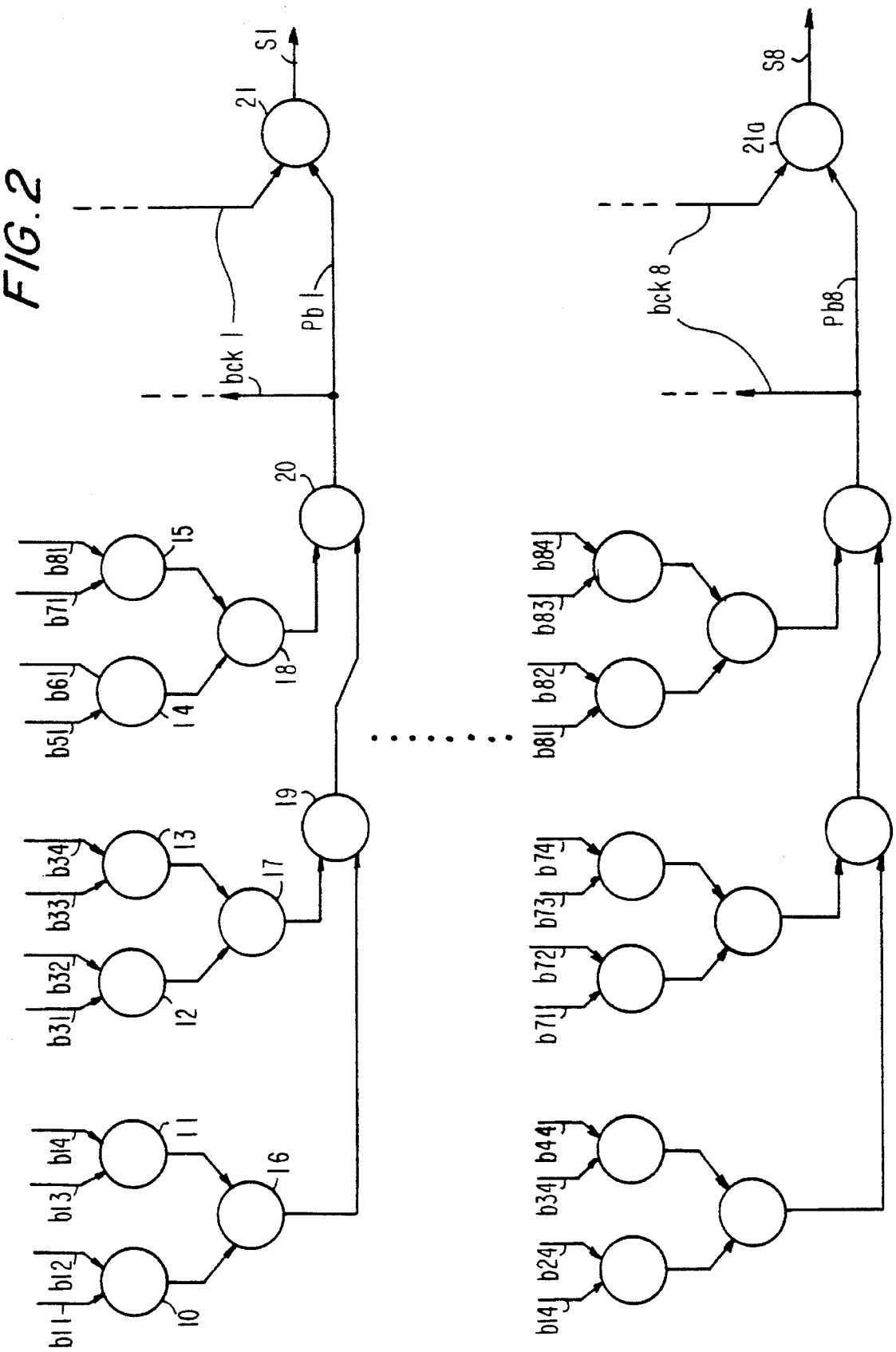
FIG. 2 is a preferred embodiment of a circuit for generating an ECC code conforming to the matrix of FIG. 1, which symbolically describes its structure and function.

For a better understanding of the invention, FIG. 1 represents a "parity check matrix" B, known in the art and described for example in cited document 1.

The matrix symbolically describes, with elements 1 and 0, the logic operations performed by an ECC code generator on 32 bit digital data organized in eight bytes of four bits each.

The matrix of eight rows r1 . . . r8, indicates with the elements 1 of each row which of the thirty two bits must be considered for the generation of parity bits of the ECC code, by means of the summing operation performed modulo 2.

The matrix in the example comprises 32 columns and structurally results from the juxtaposition of eight submatrices of eight rows and four columns, each of which is in turn constituted by a submatrix Hi of four rows and four columns (that is to say b×b) placed over or under a matrix Ib also of four rows and four columns (b×b).

It can be noted that the submatrices H1, H2, H3, H4 are disposed above the matrices Ib while the submatrices H5 . . . H8 are disposed below the matrices Ib.

The submatrices Ib, called identity matrices, contain a single 1 element for each row and column and are therefore identified by a diagonal of 1s and are all identical to one another.

In practice, the disposition of the 1s can be arbitrary as long as each row and column has a single 1 element.

The matrix also includes, on the right of FIG. 1, an eight bit square sub-matrix Ir, which is also an identity matrix, and forms with the parity check matrix B a matrix H which, as will be explained, may be described as a syndrome generation matrix.

The matrix H is therefore constituted overall by a 32 column matrix B and an adjacent eight column matrix Ir.

For simplicity of description the matrix H can be considered as being constituted by two quadrants, respectively an upper quadrant (constituted by the rows R1, R2, R3, R4) and a lower quadrant (constituted by the rows R5, R6, R7, R8).

As opposed to the identity submatrices Ib and Ir the submatrices Hi are formed by rows which are either all 1 elements or all 0 elements.

Each submatrix Hi contains an even non-zero number of rows of all 1 elements, the remaining rows having all 0 elements.

All the submatrices Hi of the same quadrant are non-zero and distinct, obtained as permutations with repetition of two rows of 1s and two rows of 0s.

In the example there are illustrated only four separate matrices, but it is evident that the maximum possible number is six.

It is also possible to obtain a submatrix distinct from the preceding ones with four rows of 1s.

The zero matrix, without any rows of 1 elements is preferably not used for reasons which will be explained hereinafter.

The matrix B symbolically describes an ECC code generator circuit for 32 bit digital data.

That said, it can be extended to an eight bit ECC code generator circuit for digital data of 4×14=56 bits which has the same characteristics and of which the matrix B illustrated in FIG. 1 constitutes a "shortened" matrix.

The matrix H obtained by associating the identity matrix Ir with the matrix B symbolically describes an 8 bit syndrome generator circuit which upon receiving at its input a 32+8 bit code word, that is accompanied by an ECC code constructed using the criteria set by the matrix B, generates an 8 bit syndrome code which, in dependence on the number of 1 bits and on their arrangement in the code, allows the correctness or possible errors in the received code word to be detected as well as the position of any errors in the code word.

FIG. 2 shows a preferred embodiment of an ECC code generator for generating codes conforming to the matrix of FIG. 1, limited to the generation of check bits bck1 and bck8 and therefore to the rows r1 and r8 of the matrix.

The bits of the digital data are indicated by bij where i is a byte index and j is an index of the bit in the byte.

Thus the bits b11 and b12 are applied to the input of an EXOR10 (EXOR indicates a logic circuit for performing the exclusive OR operation), the bits b13 and b14 are applied to the inputs of an EXOR 11, bits b31, b32 to the input of an EXOR 12, bits b33, b34 to the input of an EXOR 13, bits b51, b61 to the input of an EXOR 14 and bits b71, b81 to the input of an EXOR 15.

The outputs of the EXORs 10, 11 are connected to the inputs of an EXOR 16, those of the EXOR 12 and 13 to the inputs of an EXOR 17, those of the EXORs 14, 15 to the inputs of an EXOR 18.

The outputs of the EXORs 16, 17 are connected to the inputs of an EXOR 19 and finally the outputs of the EXORs 19, 18 are connected to the inputs of an EXOR 20 at the output of which appears a signal or bit bck1 representative of the sum in modulo 2 of the bits/signals input to the network, and therefore the parity bit for the group of bits considered.

The structure of the other logic networks which generate the parity bits bck2 . . . bck8 conforming to the rows r2 . . . r8 of matrix B and of which there is shown only the network for the generation of the bit bck8 are entirely similar and, after what has been said, do not require a specific description.

In a memory system the ECC parity code constituted by bits bck1 . . . bck8 is stored in memory together with the digital data and forms with this a code word.

When the code word is read it is subjected to the same treatment.

The bits b11 . . . b84 are selectively summed modulo 2 with the same network as illustrated in FIG. 2 in order to reconstruct 8 parity bits pb1 . . . pb8.

If the information extracted from the memory coincides with that written the parity bits pb1 . . . pb8 must coincide with the bits bck1 . . . bck8 written to memory and extracted from it (assuming that the bits bck1 . . . bck8 are not affected by errors).

The comparison is performed by eight EXORs 21 . . . 21a which receive at their input the pairs of bits pb1, bck1 . . . pb8,bck8, and produce at their outputs a syndrome code s1 . . . s8.

This comparison operation is represented in FIG. 1 by the identity matrix Ir.

In the absence of errors (on the data bits or on the check bits) the syndrome is constituted by all 0 bits.

In the presence of errors, one or more syndrome bits are 1s and their arrangement and number in the syndrome makes it possible to detect the presence of the error or errors and even, for some errors, their position.

For example, by considering the matrix of FIG. 1 it is evident that a single error in bit b11 manifests itself as a syndrome vector 10101000 and that other different single bit errors present a different syndrome.

Therefore the syndrome 10101000 makes it possible to recognize that the bit b11 is in error and to correct it, naturally on the hypothesis that there are no other errors, in which case the syndrome could also have other significance.

For example, the syndrome 10101000 can also indicate that the three check bits bck1, bck3 and bck5 are simultaneously in error.

These ambiguities can be resolved in some cases with probabilistic criteria; the probability that a triple error due to simultaneous failure of three chips or in the case of a memory having b bits per chip, in more than one chip (two in the example of FIG. 1) is so low with respect to that of failure of a single chip, that the syndrome 10101000 can be attributed without excessive risk of mistake to a failure in a single chip and therefore an error in bit b11.

Apart from these criteria the syndromes generated must be distinct with respect to the events which it is desired to identify.

The problem of defining syndromes with an adequate ability to discriminate the group of events which it is desired to identify leads therefore back to the study of the properties of matrices as a function of their structure.

It has been known for some time that a matrix such as that of FIG. 1 which allows identification and correction of single errors, and therefore enjoys the property SEC, allows detection of double errors, however disposed, and therefore enjoys the property DED, and finally allows the detection of any number of byte errors, i.e., number of errors in a single byte, (correctable if single errors).

In addition to these properties it is however possible to verify that in the case of triple byte errors, e.g., triple errors in a single byte, the syndrome thus formed comprises 2+3 1 bits disposed alternatively in the first and second syndrome. quartet (or quadrant of matrix H), and is distinct for each byte, is distinct from the single or double error syndromes, and is distinct from the quadruple byte errors.

Moreover the triple error syndrome allows identification both of the error byte and the error bits within the byte.

More generally, it is possible to show that this property, that is the capacity of identifying single errors and their position, detecting double errors, verifying odd byte errors, i.e., odd number of errors in a single byte, and their position, and detecting even byte errors, e.g., even number of errors in a single byte, without identification of their position, is common to all classes of parity check matrices which satisfy various requirements.

This is not the place to present a mathematical demonstration, which will eventually be the subject of a separate scientific publication.

Here it is sufficient to identify the requirements which the parity check matrices B and syndrome generation matrices H must have:

1) the matrix B for k bit digital data organized in bytes of b bits must be constructed as the juxtaposition of K submatrices Bi of r rows and b columns (with K=k/b, counting any possible fractions as unity)

$$B(r \times bK) = |B1 \ldots Bi \ldots BK|$$

2) The submatrices Bi (r×b) of r rows and b columns must be non-zero and distinct and each formed by the vertical superimposition of an identity matrix Ib of b rows and columns and of a submatrix Hi of r−b rows and b columns.

3) The column vectors of the matrix B must be distinct from one another and non-zero.

4) The submatrices Hi must each be constituted by an even number $\geq 2$ rows with the elements all being 1 variously permutated, the remaining rows being 0s.

5) The number r of rows must be $\geq b+2$.

On the basis of these essential requirements matrices can be constructed which enjoy the described property, with different criteria, and for each of these can be identified the maximum value of K, that is the maximum possible length of the matrix.

As the most typical case one can consider that in which r=2b.

In this case the maximum number KM of submatrices Bi is given, as can be easily checked, by $$KM = 2^b - 2.$$

The matrix B can be constructed as the juxtaposition of a first plurality of submatrices $$Bi = \begin{vmatrix} Hi \\ Ib \end{vmatrix}$$

the maximum number of which is equal to $(2^b-2)/2$ constituted in turn by a square submatrix Hi of b rows and columns, with a non-zero even number of rows of 1 elements, the matrix Hi being superimposed over the identity submatrix Ib.

The submatrices Hi must be non-zero and distinct and their maximum number is therefore $(2^b-2)/2$.

A second plurality of submatrices Bj, the maximum number of which is equal to $(2^b-2)/2$ is constituted by submatrices $$Bj = \left| \begin{array}{c} Ib \\ Hi \end{array} \right|$$

In which the identity submatrix Ib is superimposed over the matrix Hi.

For this class of matrices the relations r=2b and KM=$2^b$-2 define, with b fixed, the number r of bits of ECC necessary to encode data in dependence on its length and, vice versa, the maximum length of data which can be encoded in dependence on r.

For example, if r=8, KM=$2^b$-2=14 and the maximum length of the data is equal to 56 bits. A second class of matrices is obtained for r>2b.

In this case the matrix B can be constructed as the juxtaposition of a plurality of distinct non-zero submatrices Bi the number of which is equal to K0+K1, a first plurality Ko of submatrices being given by $$Bi = \left| \begin{array}{c} Hi \\ Ib \end{array} \right|$$

and a second plurality K1 being given by $$Bj = \left| \begin{array}{c} Ib \\ Hj \end{array} \right|$$

The submatrices Hi have r-b rows and b columns and include a non-zero even number of rows with all 1 elements and the remaining rows with all 0 elements.

The maximum number KOM of submatrices Hi is therefore equal to $2^{r-b-1}-1$.

The submatrices Hj have r-b rows and b columns and comprise a non-zero even number of rows with all 1 elements and the remaining rows with all 0 elements.

Since the submatrices Hi, Hj have rows belonging to the same row of matrix B, the column vectors of the submatrices Bj must be different from the column vectors of the submatrices Bi.

This condition limits the number of usable submatrices Hj to a maximum number of distinct submatrices equal to K1M=$2^{r-b-2}-1$.

For this class of matrices the relations r>2b and KM=KOM+K1M=$2^{r-b-1}+2^{r-b-2}-2$ define, with b fixed, the number r of bits of ECC to encode data in dependence on its length and, vice versa, the maximum length of data which can be encoded in dependence on r.

For example, if r=8 and b=3, then KM=22 and the maximum length of data which can be encoded is b×KM=66 bits.

A third class of matrices can be obtained for b+2≦r<2b.

In this case, too, the matrix B can be constructed as the juxtaposition of a plurality of submatrices given by $$Bi = \left| \begin{array}{c} Ib \\ Hi \end{array} \right|$$

Or equivalently by $$Bi = \left| \begin{array}{c} Hi \\ Ib \end{array} \right|$$

Where Ib is an identity submatrix of b rows and columns and Hi is a submatrix having r-b rows and b columns comprising a non-zero even number of rows of 1 elements and the remaining rows all 0 elements, the various submatrices Hi being distinct from one another.

Obviously in this case the maximum number of submatrices Hi and therefore Bi is given by KM=$2^{r-b-1}-1$.

With matrices of this type it is therefore possible to generate syndromes which allow correction of an odd number of errors in the same byte. One can therefore make an error correction apparatus which exploits this property and is represented in block diagram form in FIGS. 3 and 4.

Figure 3:
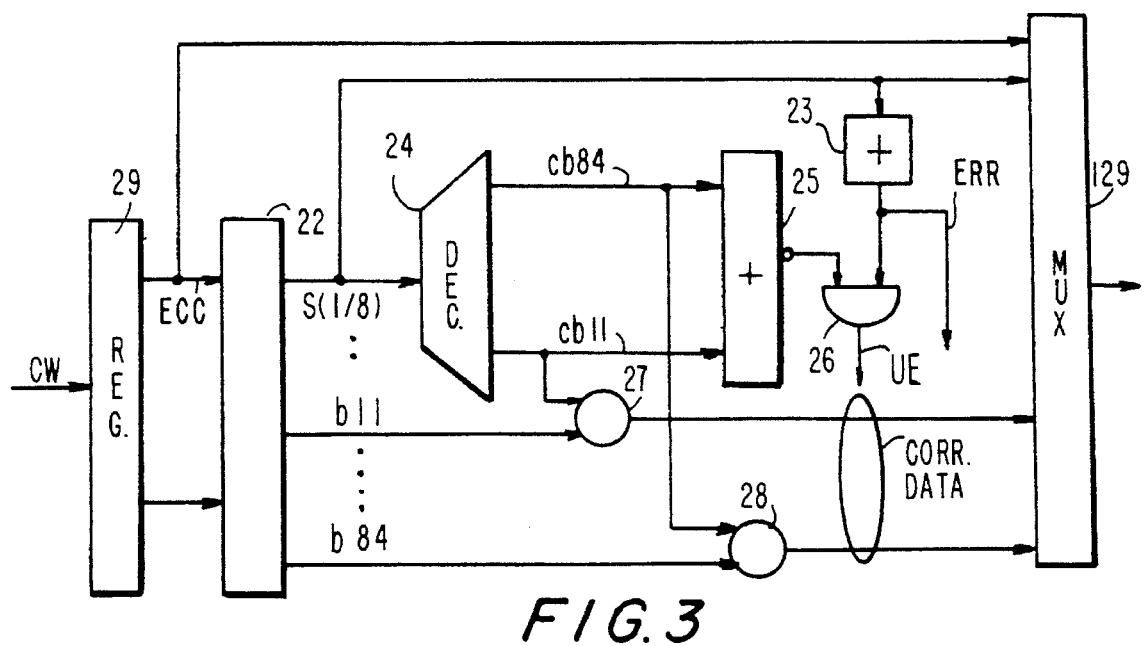
FIG. 3 shows in schematic, block diagram form an error correction apparatus formed in accordance with the present invention.

In FIG. 3 a code word, encoded by using a coding matrix with the indicated requirements and written in a memory system is read from memory and applied to the input of an error correction apparatus.

The apparatus comprises an input register 29, a syndrome generator 22 which receives at its input the code word CW and transfers at its output the read digital data RDAT and the syndrome code S(1:8).

The syndrome code is applied to the input of an OR logic element 23 which detects the possible presence of one or more 1 bits and correspondingly presents an error signal ERR at its output.

The syndrome is also applied to the input of a decoder 24 which, in dependence on the syndrome configuration, generates at its output a correction signal at level 1 on one or more of K correction outputs cb1 ... cbK, the number K of outputs being equal to the number K of bits of the data read.

All the outputs cb1 ... cbK are applied to the input of a NOR logic element 25 the output of which is connected to one input of an AND gate 26 which also receives the signal ERR at an input.

If the signal ERR is present and no correction signal is asserted by the decoder 24, the gate 26 asserts a signal UC indicative of a non-correctable error.

The outputs cb1 ... cbK are each connected to one input of a corresponding EXOR element 27, 28 which receives at a second input a corresponding bit b1 ... bk of the read data RDAT.

The correct data CORR DATA is therefore available at the output of the various EXOR elements. An output multiplexer 129, having inputs connected to the outputs of the EXOR elements 27, 28, the ECC outputs of the register 29, and the syndrome outputs of the generator 22, allows the correct data or the syndromes and the ECC codes for possible analysis to be transferred onto a data channel DBUS.

Figure 4:
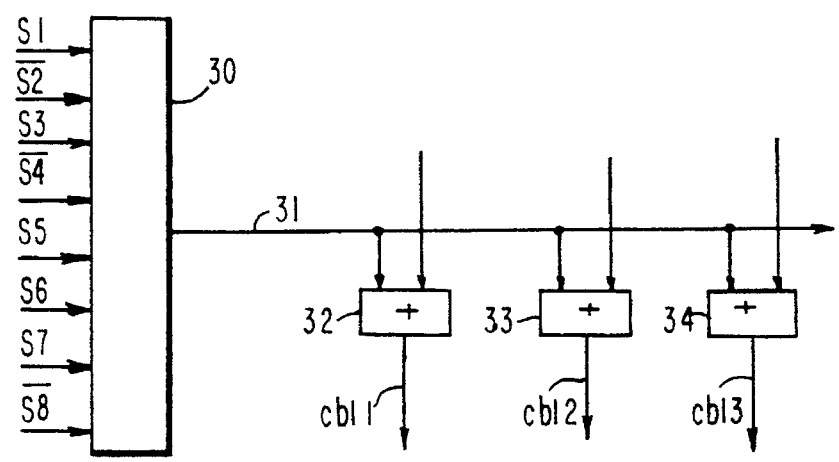
FIG. 4 shows an odd-multiple-byte error decoding element for the apparatus of FIG. 3.

FIG. 4 represents a generalized embodiment of decoder element for the decoder 24.

The decoder 24 can comprise a plurality of logic AND gates, as many as there are different syndromes to be recognized, which selectively receive at their inputs the syndrome bits to check at level 1 and the inverse of the syndrome bits to check at level 0.

In FIG. 4 there is for example shown a decoder element constituted by an AND gate 30 which receives at its input the syndrome bits S1, S3, S5, S6, S7 in direct form and the bits S2, S4, S8 in inverse form. By correlating this example to FIG. 1 it is evident that the syndrome at the input of gate 30 is indicative of a triple error in byte 1 which affects bits B11, B12, B13.

Correspondingly, the output 31 of the gate 30 goes to 1 upon recognition of the syndrome and applies, via OR gates 32, 33, 34, a level 1 to the correction outputs Cb11, Cb12, Cb13 to correct the error bits.

The OR gates 32, 33, 34 have other inputs for receiving single error correction signals, coming from other decoder elements, as well as other signals for correction of triple errors for different sets of three bits.

The preceding description has shown that for b=4 and r=8 the maximum length of word which can be corrected by an SEC-DED-SBED-OSBEC code is 56 bits.

The matrices described are therefore perfectly adapted, with redundancy, to correcting 32 bit words with 8 bits of ECC, achieved with 4 bits-per-chip memory chips currently available on the market.

In this case the error correction matrices can be of shortened type.

If, on the other hand, the word length is 64 bits, 8 bits of ECC are no longer sufficient and it would be necessary to use 9 bits, with serious constructional implications such as the joint use of 4 bit and 1 bit memory chips or a considerable waste if use were made of 4 bit chips for the additional ECC bit which is required.

According to a further aspect of the present invention, which shows the flexibility of use of the described classes of matrices for producing a correction apparatus having OSBEC operation, the described matrices can be "extended" by giving up only partially the OSBEC functionality, that is the real time correction functionality, which can be replaced, for cases of triple byte error not covered, by software correction procedures.

These procedures can be extremely simple since, as will be seen, the uncertainty in the identification of the byte is limited to only two alternative bytes.

Figure 5:
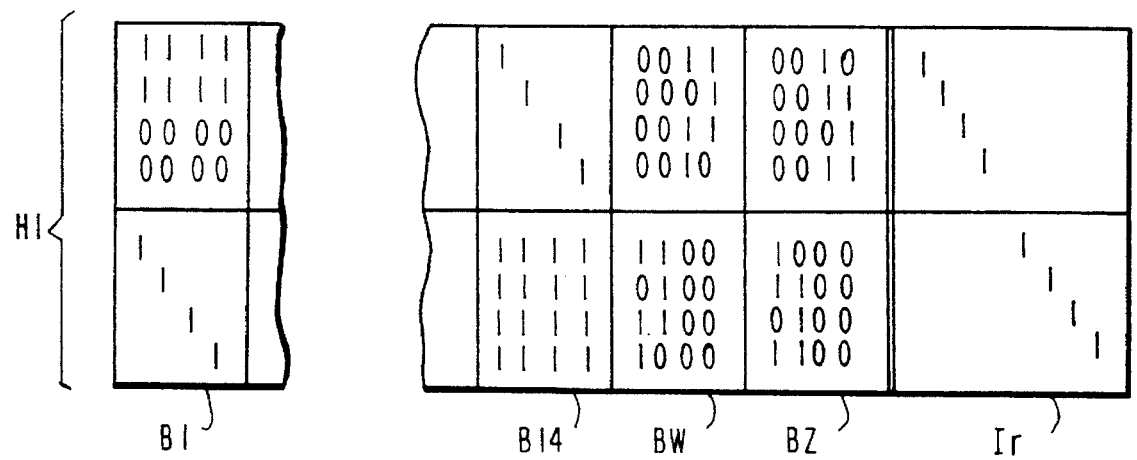
FIG. 5 represents a portion of a parity check matrix "extended" in a preferred embodiment of an error correction apparatus.

With these premises one can consider FIG. 5 which partially represents the error correction matrix B and syndrome generation matrix H=|B Ir| for r=2b=8, k=64 and K=64/4=16. The submatrices B1 ... Bi ... B14 constructed as already explained have added to them two submatrices Bw, Bz constructed with the following criteria.

One can observe that the 56 single error syndromes, generated by the submatrices Bi are constituted by 48 syndromes having 3 bits, two of which are disposed in one quadrant and the other in the opposite quadrant, and, 8 syndromes of 5 bits, four of which are disposed in one quadrant and one in the other.

However the permutations with repetition of 3 bits to 1 in an 8 bit code are 8!/3!·5!=56.

There therefore remain available 8 permutations constituted by three 1 bits and five 0 bits with the three 1 bits belonging to the same quadrant.

These permutations can be used as column vectors, distinct from one another, for the construction of the submatrices Bw, Bz by making them available in such a way that each submatrix contains a pair of column vectors with 1 elements disposed in the upper quadrant and a pair of column vectors with 1 elements disposed in the lower quadrant.

The possible distinct submatrices formed in this way are distinct from matrices Bi.

The matrices Bw and Bz make it possible to obtain single error syndromes relating to a further 8 bits in addition to the 56 covered by the submatrices Bi but involve some problems.

The single error syndromes relating to the bits B55–B64 have three bits disposed in the same quadrant (upper or lower) and are confused with the triple byte error syndromes relating to the check bits, these also having 3 bits disposed in the same quadrant.

If the probability of triple byte error is very much less than that of single error, one can settle the uncertainty by attributing the syndrome to a single error, except that periodic functionality checks are performed on the memory chip intended to store the check bits.

The even error syndromes do not allow, in any case, the identification of the location of the errors, and from this point of view the introduction of the two matrices Bw, Bz does not involve any problems.

The 16 triple byte error syndromes covered by the submatrices Bw, Bz, as easily verified, contain three error bits in one quadrant and two error bits in the other quadrant and, in as much as they are different from one another and able to discriminate the bits affected by errors within the byte each is identical to a triple error syndrome relating to another byte covered by the matrices Bi.

Therefore with this extension the matrix Hi of FIG. 5 is also able to identify and correct a certain number of triple errors, but only 48 of them that is 75% of those possible.

For the others, the correction can still be made since each syndrome identifies a given pair of bytes where the triple error can be present.

This is therefore in a completely different situation from that of double or even errors in which the position of the errors is completely indeterminate.

The detection and correction of errors can therefore easily be effected with a process of identification of the defective chip which provides for:

A) A first repetition of the reading of the information to check that the triple error is permanent.

B) Arbitrary choice as a function of the syndrome of one of the possible bytes affected by errors and the identification of the potential error bits within the byte.

C) Rewriting to the memory the information read with the inversion of a single bit of the three potential error bits (this involves the generation of a new ECC code relative to the written information).

D) Reading from the memory the information written thereto and checking of the new syndrome.

If the new syndrome indicates the presence of a single error and identifies it (necessarily in the byte which has been modified) the byte having the triple error has been correctly identified and it is sufficient to correct (with inversion) the other two erroneous bits.

If the new syndrome does not identify any errors, the byte having triple errors is that of the two possible bytes which has not been modified and which now can be corrected integrally. For security it can also be checked, with a repeated write and read operation of the correct information as in C and D (with inversion of one bit in the byte recognized as in error), that the error is permanent and relates to the byte thus identified.

Figure 6:
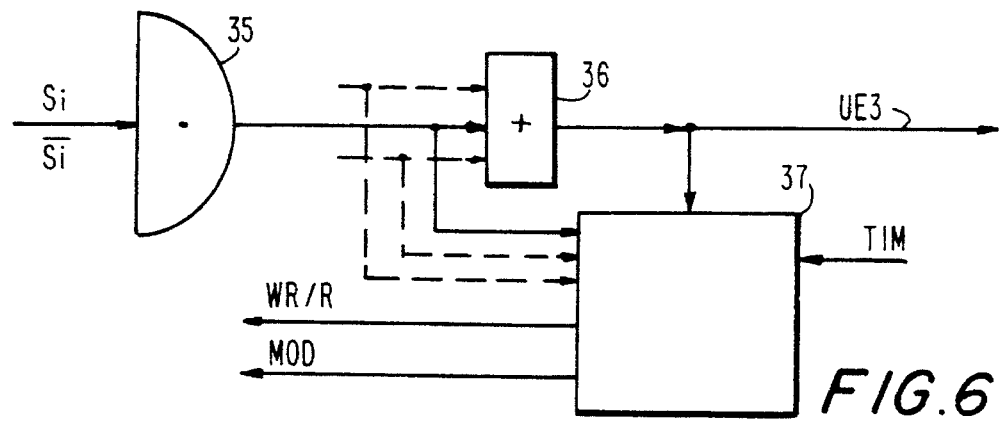
FIG. 6 schematically represents a first constructional detail of one embodiment of an error correction apparatus.

To execute this procedure rapidly, without loss of time in analysis of the syndrome, the error correction apparatus can include, as illustrated in FIG. 6, AND and decoder elements (such as the AND 35) equivalent to the element 30 of FIG. 4, which in the presence of an ambiguous syndrome generates, via an OR gate 36, a signal UE3 indicating a noncorrected but correctable triple error.

This signal, recognized by the processor which had requested the read operation, can be used to immediately start a correction process under its control such as that already described.

Alternatively, automatic execution of the process can be envisaged, without the intervention of any processor, by providing in the error correction apparatus a control logic 37, preferably a suitably timed state machine, which, activated by the UE3 signal and receiving from the gates such as AND 35 (the corresponding syndrome decoding unit,) a triple error signal specific to a pair of bytes and related error bits, generates suitable signals for modification of the information read and for write/read of the memory at the same address, thereby providing the correction operation autonomously.

Figure 7:
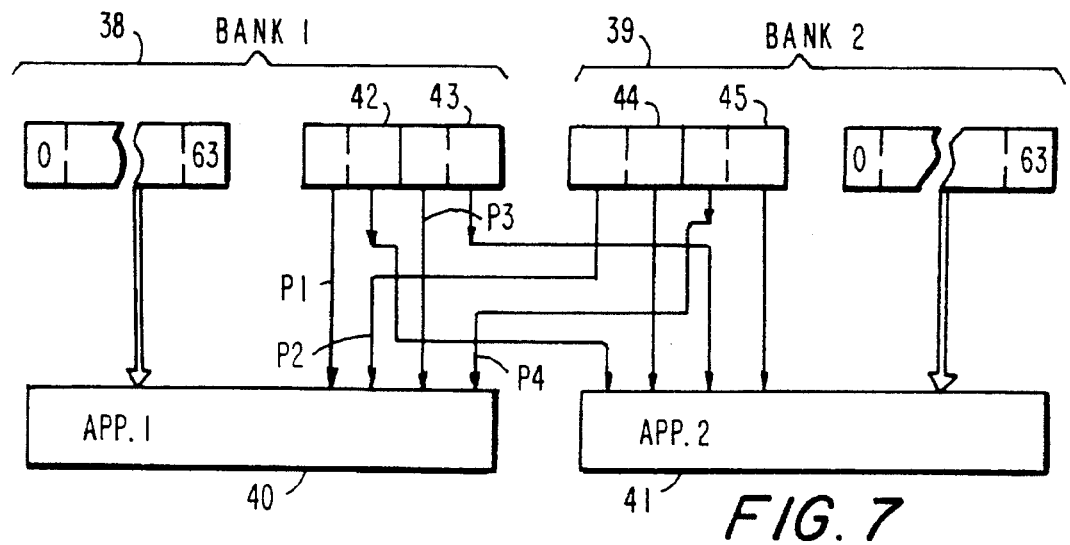
FIG. 7 schematically represents a second constructional detail of a preferred embodiment of error correction apparatus.

FIG. 7 represents a further improvement which allows any ambiguity in the interpretation of a single error syndrome in an extended matrix to be resolved, and is applicable to memory systems having high parallelism, multiples of 64 bits, in which each block of 64 bits is provided with self-contained error correction apparatus which employs 8 bit syndromes.

As illustrated in FIG. 7 the memory system comprises a first bank 38 of 4 bit memory chips (BANK1) with overall parallelism of 72 bits and a second bank 39 of 4 bit memory chips (BANK2) with an overall 72 bit parallelism.

The bits of data output from the bank 38 are applied to the input of a first error correction apparatus 40 with a correction matrix identical to that of FIG. 5 and the data bits DBIT 2 output from the bank 39 are applied to the input of a second error correction apparatus 41 identical to the apparatus 40.

On the other hand the check bits output from a chip 42 of the bank 38 are applied in pairs, respectively P1, P2 to the input of the apparatus 40 and 41.

Similarly the check bits output from a chip 43 of the bank 38 are applied in pairs, respectively P3, P4, to the input of the apparatus 40 and 41.

The check bits output from a chip 44 of the bank 39 are applied in pairs P5, P6 respectively to the input of the apparatus 40 and 41.

Finally check bits output from a chip 45 of the bank 39 are applied in pairs P7, P8 respectively to the inputs of the apparatus 40 and 41.

The same operation of remixing and distribution of the check bits takes place upon the act of generation and storage in memory.

With this arrangement the check bits relating to information stored in bank 1 are in part stored in chips 42, 43 and in part in chips 44, 45, each chip containing only two bits of the ECC code.

The result is that a triple error on the ECC code can only result from simultaneous failure of at least two chips and is therefore extremely improbable.

I claim:

1. Error correcting apparatus (SEC-DED-SBED-OSBEC) for the correction of errors in digital information comprising a plurality of bytes, each of b bits, for correcting single errors (SEC), at least part of all possible odd numbers of errors in a single byte (OSBEC) and detecting double errors (DED) and multiple errors in a single byte (SBED), the digital information being constituted by a codeword of n=r+k bits with k data bits and r error correction and check bits, the said r check bits, where r≧2, being obtained from r separate summations, modulo 2, of a plurality of data bits selected in accordance with a parity check bit generation matrix having r rows and bK columns, with non-zero column vectors distinct from one another, at least a portion of the said matrix given by $$B(r \times bK) = |B1, \ldots Bi \ldots BK|$$

that is from the juxtaposition of K non-zero and distinct submatrices, in which the submatrices Bi(r×b) having r rows and b columns, are each formed by the vertical superimposition of a submatrix $I_b$ of b rows and b columns with a single 1 element per row and column and a submatrix Hi or r−b rows and b columns, the said submatrices Hi each being constituted by an even number ≧2 of all 1 rows, and the remaining rows having all 0 elements, said error correcting apparatus comprising first logical circuits receiving the said codeword at their input to generate a syndrome code having r bits by means of r distinct modulo 2 sums of a plurality of code bits selected in accordance with a syndrome generation matrix, at least a portion of the said syndrome generation matrix being given by $$H = |B(r \times bK) \; Ir|$$

where B (r×bK) is the parity check bit generation matrix, and Ir is a r row and r column identity submatrix adjacent to the matrix B (r×bK), said error correcting apparatus comprising:

second logic circuits receiving the said r bit syndrome at its input to identify from the said syndrome the presence in the said codeword of a single error and its position in the codeword, a double error, an odd number of errors in the same byte and their position in the said codeword, and multiple errors in the same byte, and third logic circuits receiving k bits of data of the said codeword at their input, controlled by the said second logic circuit to correct the said single or odd number of errors within a byte, identified in number and position in the said k bits of the codeword.

2. Apparatus as in claim 1, in which r=2b and the said number of submatrices Bi is $$K \leq KM = 2^b - 2$$

comprises a plurality ≦K/2 of non-zero and distinct submatrices $$Bi = \begin{vmatrix} Hi \\ Ib \end{vmatrix}$$

and a second plurality ≦K/2 of non-zero and distinct submatrices $$Bj = \begin{vmatrix} Ib \\ Hi \end{vmatrix}$$

where Ib is an identity submatrix having b rows and b columns and Hi is a plurality of non-zero distinct submatrices of b rows and b columns, constituted by an even number of rows ≧2 of all 1 elements and the remaining rows of all 0 elements.

3. Apparatus as in claim 1, in which r>2b and the said plurality of submatrices Bi is K0+K1 submatrices where $$K0 \leq K0M = 2^{r-b-1} - 1$$

and $$k1 \leq K1M = 2^{r-b-2} - 1$$

comprising a first plurality of K0 submatrices $$Bi = \begin{vmatrix} Hi \\ Ib \end{vmatrix}$$

and a second plurality of K1 submatrices $$Bj = \begin{vmatrix} Ib \\ Hj \end{vmatrix}$$

where Ib is an identity submatrix having b rows and columns and Hi,j is one of a plurality of non-zero distinct submatrices of r−b rows and b columns constituted by even numbers of rows ≧2 with all 1 elements, the remaining rows having all 0 elements, the column vectors of the submatrices Bi, Bj being all distinct.

4. Apparatus as in claim 1, in which $b+2 \leq r < 2b$ and the number of the said submatrices Bi is $$K \leq KM = 2^{r-b-1} - 1$$

the said submatrices $$Bi = \begin{vmatrix} Ib \\ Hi \end{vmatrix} \text{ or } \begin{vmatrix} Hi \\ Ib \end{vmatrix}$$

each being constituted by the superimposition of an identity submatrix of b rows and columns and a plurality of non-zero and distinct submatrices Hi of r b rows and b columns with even numbers of rows $\geq 2$ with all 1 elements, the remaining rows having all 0 elements.

5. Apparatus as in claim 2, in which b=4, r=8 and the said plurality K of submatrices Bi is 14, the said check bit generation matrix is given by $$B\ [r \times b(K+2)] = |B1 \ldots Bi \ldots BK, Bw, Bz|$$

the said syndrome generation matrix is given by $$H = |B, Ir| = |B1 \ldots Bi \ldots BK, Bw, Bz, Ir|$$

where Bw and Bz are two distinct and non-zero submatrices, each constituted by a pair of column vectors with three 1 elements disposed in the upper quadrant and a pair of column vectors with three 1 elements disposed in the lower quadrant.

6. Apparatus as in claim 5, comprising means for generating an uncorrected triple byte error indicator signal and means for transferring the said syndrome and the said r bits of the said codeword to a data channel.

7. Apparatus as in claim 5, including check bit storage means for storing pairs of said check bits in separate memory elements (chips).

\* \* \* \* \*